US009408292B2

(12) United States Patent
Mills et al.

(10) Patent No.: US 9,408,292 B2
(45) Date of Patent: Aug. 2, 2016

(54) BUS APPARATUS FOR USE WITH CIRCUIT INTERRUPTERS OR OTHER DEVICES (75) Inventors: Patrick Wellington Mills, Bradenton, FL (US); James Michael McCormick, Bradenton, FL (US); Richard George Benshoff, Sarasota, FL (US)

(73) Assignee: Labinal, LLC, Denton, TX (US)

( * ) Notice: Subject to any disclaimer, the term of this patent is extended or adjusted under 35 U.S.C. 154(b) by 83 days.

(21) Appl. No.: 14/123,857

(22) PCT Filed: Jun. 21, 2012

(86) PCT No.: PCT/US2012/043463
§ 371 (c)(1),
(2), (4) Date: Dec. 4, 2013

(87) PCT Pub. No.: WO2012/177826
PCT Pub. Date: Dec. 27, 2012

(65) Prior Publication Data
US 2014/0110154 A1    Apr. 24, 2014

Related U.S. Application Data (60) Provisional application No. 61/499,404, filed on Jun. 21, 2011.

(51) Int. Cl.
H05K 1/02    (2006.01)
H05K 3/20    (2006.01)
H02B 1/056   (2006.01)

(52) U.S. Cl.
CPC .................. *H05K 1/02* (2013.01); *H05K 3/202* (2013.01); *H02B 1/056* (2013.01); *H05K 1/0263* (2013.01); *H05K 1/0298* (2013.01); *H05K 2201/10272* (2013.01); *Y10T 156/10* (2015.01)

(58) Field of Classification Search
USPC .................................. 361/636, 624, 622, 644
See application file for complete search history.

(56) References Cited

U.S. PATENT DOCUMENTS 4,689,718 A * 8/1987 Maue .................. B60R 16/0238
361/644
5,478,244 A * 12/1995 Maue .................. B60R 16/0238
361/752

(Continued)

FOREIGN PATENT DOCUMENTS

| CN | 101237102 | 8/2008 |
| JP | 2000 299911 | 10/2000 |
| WO | 00/36726 | 6/2000 |

OTHER PUBLICATIONS

Supplementary European Search Report filed in EP 12802656 completed Oct. 19, 2014.

(Continued)

*Primary Examiner* — Timothy Thompson
*Assistant Examiner* — Michael F McAllister
(74) *Attorney, Agent, or Firm* — Kevin M. Goodman; Rankin, Hill & Clark LLP (57) ABSTRACT

An improved bus apparatus includes a generally rigid substrate and a conductor apparatus. The conductor apparatus includes a number of bus elements that are embedded within the substrate and which are electrically connected with connection elements that each have an end that is situated external to the substrate. Additional connection elements extend through the substrate and are connectable with loads. Circuit interrupters and other devices are connectable with pairs of the connector elements, wherein one connector element is connected with a line and wherein another connector element is connected with a load. The bus apparatus is formed by receiving the bus elements in channels formed in layers of a thermally conductive and electrically insulative material, and the layers are bonded together with the use of a bonding material to cause the bus elements to become laminated within the interior of the substrate.

5 Claims, 7 Drawing Sheets (56) References Cited

U.S. PATENT DOCUMENTS

| | | | | |
|---|---|---|---|---|
| 5,715,135 A * | 2/1998 | Brussalis | ............ | B60R 16/0238 361/622 |
| 6,002,580 A | 12/1999 | Levantine | | |
| 6,008,982 A * | 12/1999 | Smith | ................ | B60R 16/0238 174/538 |
| 6,015,302 A * | 1/2000 | Butts | ................... | B60R 16/0238 439/76.2 |
| 6,602,079 B2 * | 8/2003 | Chiriku | ................. | H01R 12/58 439/76.2 |
| 8,094,436 B2 | 1/2012 | Mills et al. | | |
| 8,778,220 B2 * | 7/2014 | Lee | ......................... | C08L 67/03 252/299.01 |
| 2002/0168882 A1 | 11/2002 | Chiriku et al. | | |
| 2008/0084116 A1 | 4/2008 | Terricciano et al. | | |
| 2009/0040691 A1 | 2/2009 | Latham | | |
| 2009/0265930 A1 | 10/2009 | Jandzio et al. | | |
| 2009/0269951 A1 * | 10/2009 | Scheele | ................. | H05K 7/026 439/76.2 |
| 2011/0096470 A1 | 4/2011 | Dixon et al. | | |

OTHER PUBLICATIONS

United States Patent and Trademark Office, "International Search Report and Written Opinion", Sep. 6, 2012, 8 pp.
Chinese Office action dated Mar. 21, 2016.

* cited by examiner

BUS APPARATUS FOR USE WITH CIRCUIT INTERRUPTERS OR OTHER DEVICES

CROSS-REFERENCE TO RELATED APPLICATION

The instant application claims priority from U.S. Provisional Patent Application Ser. No. 61/499,404 filed Jun. 21, 2011, and entitled Composite Electric Module for Circuit Breaker Panels and Method of Making Same, the disclosures of which are incorporated herein by reference.

BACKGROUND OF THE INVENTION

1. Field

The instant application relates generally to electrical apparatuses and more particularly, to a bus apparatus that is usable to connect circuit interrupters and other devices with circuits.

2. Related Art

Circuit interrupters of various types are generally known in the relevant art. For example, a circuit interrupter such as a circuit breaker may be placed within a circuit to open the circuit in the event of certain overcurrent conditions, undervoltage conditions, and other conditions such as fault conditions and the like. Each protected circuit typically will have its own circuit interrupter that is suited to the load and other conditions that are found in the circuit. Other devices such as thermostats, switches, and the like can also be connected with circuits.

While electrical systems that include such circuit interrupters and other devices have been generally effective for their intended purposes, they have not been without limitation. In particular, since each protected circuit must have its own circuit interrupter or be somehow connected with a circuit interrupter, and since a circuit that is intended to include a thermostat, a switch, or other such device must be electrically connected therewith, complex electrical installations often have large numbers of wires going in different directions in order to connect among electrical feed buses, circuit interrupters, other devices, and loads. The complexity of the wiring that is required to provide the connections often causes undesired complications when performing repairs or routine maintenance on such electrical installations. Such problems are exacerbated in applications that provide limited space and/or limited access to the wiring with which circuit breakers are connected, such as aerospace and marine applications and other applications. Further complexity is encountered when multiple power sources are involved with an electrical system, because the wires that are associated with each such power source typically must be physically segregated from the wires associated with the other power sources in order to avoid the potentially catastrophic results that may occur from unintended shorting between wires associated with different power sources. It thus would be desirable to provide an improvement to overcome the shortcomings of such electrical installations.

SUMMARY OF THE INVENTION

In view of the foregoing, an improved bus apparatus includes a generally rigid substrate and a conductor apparatus. The conductor apparatus includes a number of bus elements that are embedded within the substrate and that are electrically connected with connection elements that each have an end which is situated external to the substrate. Additional connection elements extend through the substrate and are connectable with loads. Circuit interrupters are connectable with pairs of the connector elements, wherein one connector element is structured to be connected with a line and wherein another connector element is structured to be connected with a load. The bus apparatus is formed by receiving the bus elements in channels formed in layers of a thermally conductive and electrically insulative material, and the layers are bonded together with the use of a bonding material to cause the bus elements to become laminated within the interior of the substrate.

Accordingly, an aspect of the disclosed and claimed concept is to provide an improved bus apparatus to which circuit interrupters can be mounted.

Another aspect of the disclosed and claimed concept is to provide a method of forming such an improved bus apparatus.

These and other aspects are provided by an improved bus apparatus that is structured to enable a number of circuit interrupters to be electrically connected with a number of circuits. The bus apparatus can be generally stated as including a substrate and a conductor apparatus. The substrate is formed of a material that is structured to be electrically resistive and thermally conductive within the ranges of voltage and temperature in which the bus apparatus is structured to typically operate. The conductor apparatus can be generally stated as including at least a first conductor assembly that can itself be generally stated as including an electrically conductive first bus element and a number of electrically conductive first connection elements. At least some of the number of first connection elements each have an electrical connection with the first bus element. The first bus element is embedded within the substrate, and the least some of the number of first connection elements each extend from the electrical connection with the first bus element and have at least one end situated external to the substrate. The conductor apparatus can be generally stated as further including a number of electrically conductive additional connection elements extending through the substrate and being electrically unconnected with the first bus element within the substrate, with at least some of the number of additional connection elements each having at least one end situated external to the substrate.

Other aspects are provided by an improved method of forming a bus apparatus that is structured to enable a number of circuit interrupters to be electrically connected with a number of circuits. Such a bus apparatus can be generally stated as including a conductor apparatus and a substrate having a plurality of layers. The conductor apparatus can be generally stated as including a number of conductor assemblies and a number of electrically conductive additional connection elements. Each conductor assembly can be generally stated as including an electrically conductive bus element and a number of electrically conductive connection elements. The substrate is formed of a material that is structured to be electrically resistive and thermally conductive within the ranges of voltage and temperature in which the bus apparatus is structured to typically operate. The method can be generally stated as including situating on each of at least some of the layers of the plurality of layers a conductor assembly of the number of conductor assemblies, interposing between the layers of each adjacent pair of layers of the plurality of layers a bonding material, and subjecting the plurality of layers and the bonding material to a formation process that comprises an application for a period of time of at least one of compression and temperature in excess of ambient conditions to bond together the plurality of layers.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION OF THE PREFERRED EMBODIMENTS

An improved bus apparatus 4 in accordance with a first embodiment of the disclosed and claimed concept is depicted generally in FIGS. 1-5 and 7. The improved bus apparatus 4 is generally rigid and is structured to be connected with one or more circuit interrupters, one of which is depicted in phantom lines at the numeral 8 in FIGS. 1-3. It is noted that the exemplary circuit interrupter 8 is but a single example of one of many other electrical devices such as switches, thermostats, relays, and the like which can be connected in such a fashion with the bus apparatus 4. The bus apparatus 4 is also connectable with a number of loads, one of which is depicted in phantom lines in FIG. 3. The bus apparatus 4 can also be installed in a circuit breaker panel for connection with circuit breakers and loads, as is indicated generally in U.S. Pat. No. 8,094,436, the disclosures of which are incorporated herein by reference.

The bus apparatus 4 can be generally said to include a substrate 16 and a conductor apparatus 20. The exemplary substrate 16 is formed of a material that is electrically resistive and thermally conductive and may be, for example and without limitation, a liquid crystal polymer (LCP) thermoplastic or other appropriate material. The conductor apparatus 20 is formed of electrically conductive materials such as copper, silver, or aluminum, by way of example, and are sized to carry predetermined current levels suited to the application.

As will be set forth in greater detail below, the conductor apparatus 20 is, in large part, embedded within the substrate 16, although portions of the conductor apparatus 20 are situated external to the substrate 16. The thermal conductivity and electrical resistance of the substrate 16 help to avoid hot spots within the bus apparatus 4 and instead helps to thermally conduct heat away from the conductor apparatus 20, which is highly desirable. The material from which the substrate 16 is formed is desirably also of a relatively high dielectric value.

In the exemplary embodiment depicted and described herein, the substrate 16 is formed from a plurality of layers 24A, 24B, 24C, and 24D that are bonded together with the use of an amount of a bonding material 28 and with the application of heat and compression thr a predetermined period of time that is described below. For example, the layers 24ABCD can each be formed of LCP or other appropriate material, with the bonding material 28 being interposed between each pair of adjacent layers 24ABCD. The bonding material 28 can be, for example and without limitation, an adhesive sheeting or epoxy-based structural tape, such as Berquist Bond-Ply 660B, which is a double-sided pressure sensitive adhesive tape manufactured by The Berquist Company of Chanhassen, Minn., and which includes a high performance, thermally conductive acrylic adhesive coated on both sides of a PEN flint. The bonding material 28 may, for example, transfer epoxy to the layers 24ABCD upon being heated and become cross-linked in order that re-heating has no effect.

It is noted, however, that other formation methodologies may be employed to form the substrate 16, such as injection molding and curing of the LCP or other material in situ about portions of the conductor apparatus 20 to cause those portions of the conductor apparatus 20 to be embedded within the substrate 16. Other formation methodologies within the scope of the present concept will be apparent.

Figures 1, 2, 3, 4:
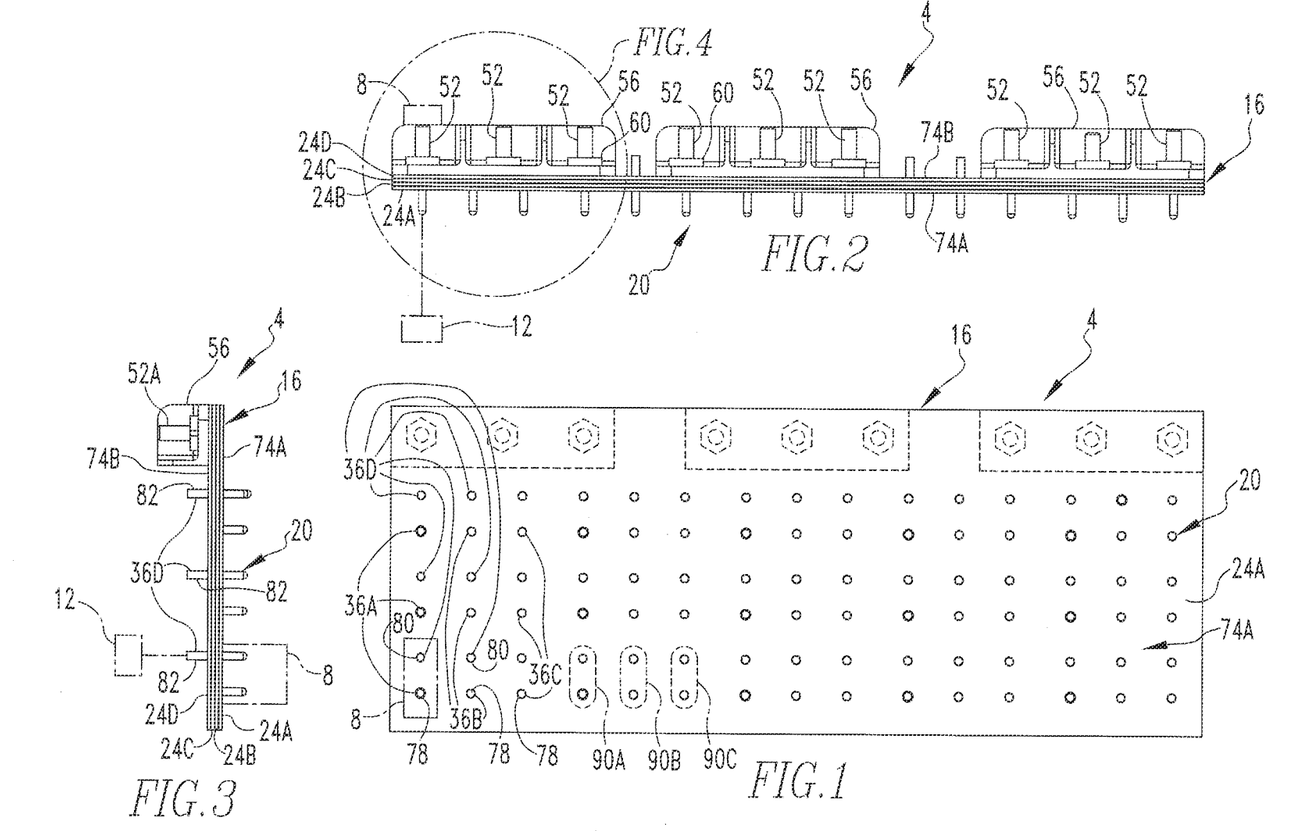
FIG. 1 is a front elevational view of an improved bus apparatus in accordance with a first embodiment of the disclosed and claimed concept.
FIG. 2 is a top plan view of the bus apparatus of FIG. 1.
FIG. 3 is a left side elevational view of the bus apparatus of FIG. 1.
FIG. 4 is an enlarged view of the indicated portion of FIG. 2.
Figure 4:
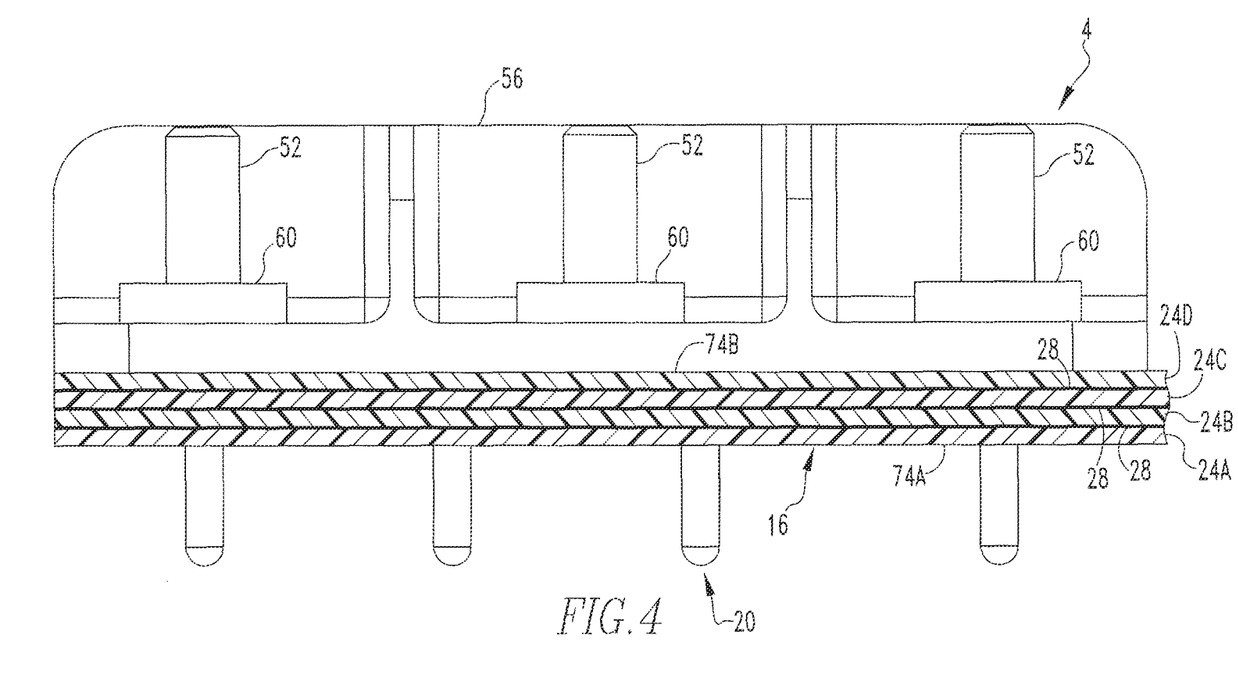
Figure 5:
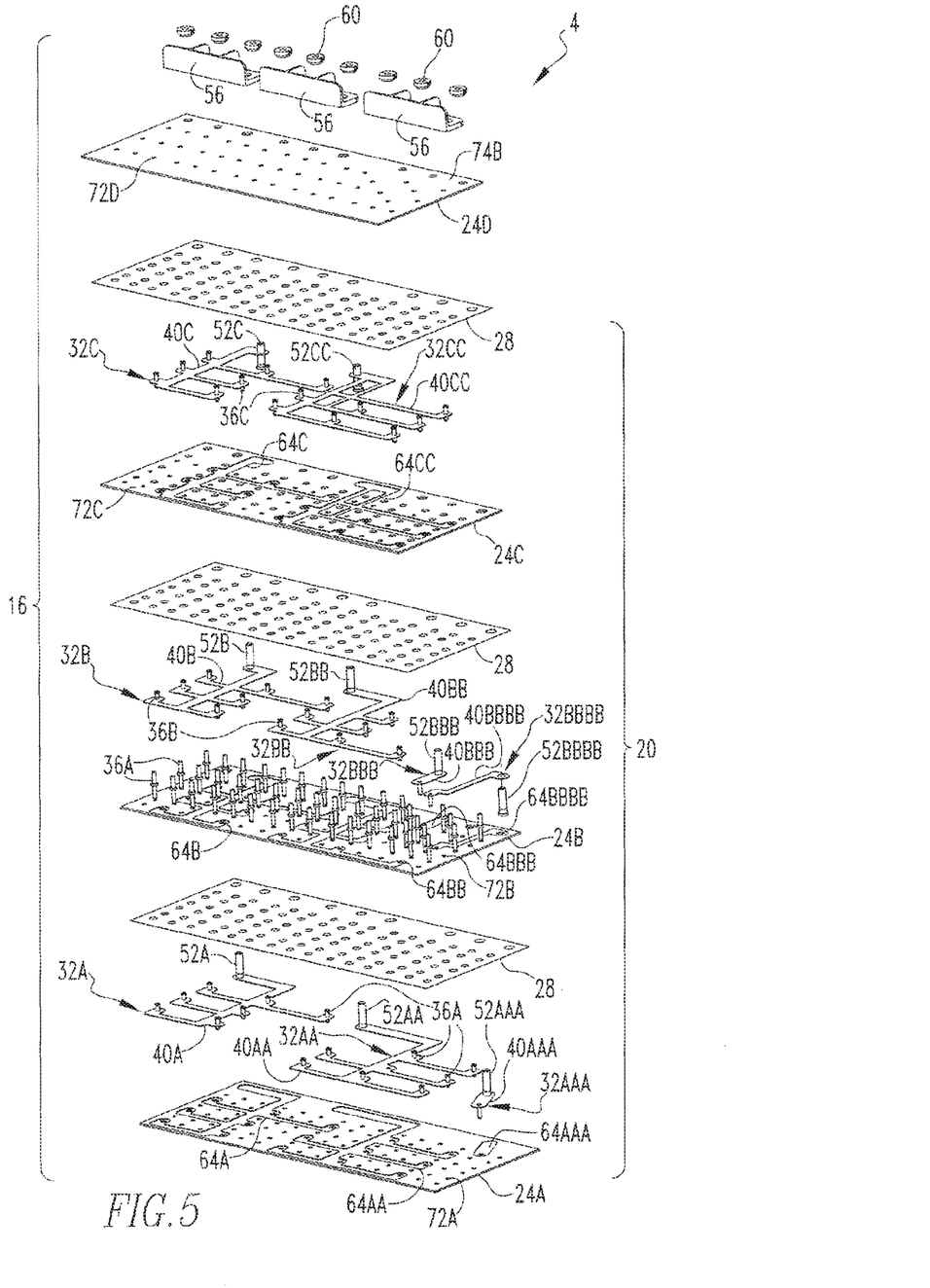
FIG. 5 is an exploded view of the bus apparatus of FIG. 1.

As can be understood from FIG. 5, the conductor apparatus 20 can be said to include a plurality of conductor assemblies, with the exemplary bus apparatus 4 described herein having nine such conductor assemblies indicated at the numerals 32A, 32AA, 32AAA, 323, 3213B, 32BBB, 32BBBB, 32C, and 32CC, and which are collectively referred to herein with the numeral 32. In the exemplary embodiment depicted herein, each such conductor assembly 32 includes a bus element (described below) that is embedded within the substrate 16. Each such conductor assembly 32 further include a number of connection elements (described below) that each have an electrical connection with the corresponding bus element at a location within the interior of the substrate 16 but that also extend from such connection to a location at the exterior of the substrate 16. As employed, the expression "a number of" and variations thereof shall refer broadly to any non-zero quantity, including a quantity of one.

For example, and as can be seen in FIG. 5, the conductor assembly 32A includes a bus element 40A and a plurality of connection elements 36A that are electrically connected with the bus element 40A. The conductor assembly 32AA includes a bus element 40AA and a plurality of connection elements 36A that are electrically connected with the bus element 40AA. The conductor assembly 32AAA includes a bus element 40AAA, and a plurality of connection elements 36A that are electrically connected with the bus element 40AAA.

In a similar fashion, the conductor assembly 3213 has a bus element 40B to which is connected a number of the connection elements 36B. The conductor assembly 32BB has a bus element 40BB to which is connected a number of the connection elements 36B. The conductor assembly 32BBB has a bus element 40BB to which is connected a number of the connection elements 36B. The conductor assembly 32BBBB has a bus element 40BBBB to which is connected a number of the connection elements 36B.

Likewise, the conductor assembly 32C has a bus element 40C with which are connected a number of the connection elements 36C. The conductor assembly 32CC has a bus element 40CC with which are connected a number of the connection elements 36C.

As can be understood from FIG. 5, the bus elements 40A, 40AA, 40AAA, 40B, 40BB, 40BBB, 40BBBB, 40C, and 40CC, collectively referred to herein at the numeral 40, are generally thin and flat and are formed of one of the electrically conductive materials mentioned herein or another appropriate material. Such bus elements 40 can be formed, for example, by any of a variety of methods such as laser cutting, stamping, wire electro-discharge machining, water jet cutting, or other appropriate method. The bus elements 40 may be, for example, 0.015 inches in thickness, which may be suitable for a seventy-five Ampere current. However, other dimensions can be appropriate for other current-carrying capabilities. Moreover, the bus elements 40 can alternatively be of other shapes, such as in the shapes of wires or other shapes, without departing from the present concept.

The exemplary connection elements 36A, as well as the other connection elements mentioned herein, are in the exemplary form of cylindrical pins that extend in a direction transverse to the plane of the corresponding bus elements 40A and 40B. Shapes other than cylindrical may be employed depending upon the needs of the application.

The conductor apparatus 20 further includes a plurality of other connectors which are collectively referred to herein at the numeral 52. One of the other connectors 52 is connected with each bus element 40 and can be used, for example, to electrically connect the bus element 40 with a power source. Such other connectors thus are referred to herein as line connectors, although the expression is intended to not be limiting since they can be otherwise connected without departing from the present concept. As can be seen in FIG. 5, the bus elements 40A, 40AA, 40AAA, 40B, 40BBB, 40BBB, 40BBBB, 40C, and 40CC each have a line connector 52A, 52AA, 52AAA, 52B, 52BB, 52BBB, 52BBBB, 52C, and 52CC, respectively, connected therewith. In the exemplary embodiment described herein, the line connectors 52 each have a threaded end that is cooperable with a nut 60 for connection with the power source, by way of example. The conductor apparatus 20 further includes a plurality of terminal stops 56 which are disposed on the substrate 16 in order to facilitate such connection. The terminal stops 56 may potentially be mounted on the substrate 16 with the use of some type of an adhesive or bonding agent, if desired.

As can further be seen in FIG. 5, at least some of the layers 24ABCD in the depicted exemplary embodiment have a number of channels formed therein that are structured to receive therein the bus elements 40 prior to bonding toaether of the layers 24ABCD to form the substrate 16. In particular, the layer 24A has a pair of channels 64A, 64AA and 64AAA formed therein that are structured to receive therein the bus elements 40A, 40AA, and 40AAA. The channels 64A, 64AA, and 64AAA each include one or more elongated channel segments that are connected together and that are sized to accommodate therein the bus elements 40A, 40AA, and 40AAA. In a similar fashion, the layer 24B has a set of channels 64B, 64BB, 64BBB, and 64BBBB formed therein that are structured to accommodate and to receive therein the bus elements 40B, 40BB, 40BBB and 40BBBB. The layer 24C likewise has a pair of channels 64C and 64CC formed therein to receive the bus elements 40C and 40CC. As can further be seen in FIG. 5, the layers 24ABCD each have a plurality of holes formed therein that are shown generally at the numerals 72A, 72B, 72C, and 72D, respectively, and which are positioned and sized to accommodate therein at least a portion of each of the connection elements 36ABCD. For example, the layer 24A has a plurality of holes 72A formed therein, the layer 24B has a plurality of holes 72B formed therein, the layer 24C has a plurality of holes 72C formed therein, and the layer 24D has a plurality of holes 72D formed therein. The holes 72A receive the connection elements 36A therein. It can likewise be said that the holes 72B receive the connection elements 36B therein, that the holes 72C receive the connection elements 36C therein, and the holes 72D receive the connection elements 36D therein. It is noted, however, that the holes 72ABCD are generally aligned with one another when the substrate 16 is assembled, and it therefore can be seen that certain of the connection elements 36ABCD are each received through the holes 72ABCD in more than one of the layers 24ABCD. For example, the connection elements 36D are each received in the holes 72ABCD and moreover extend to a region exterior to the substrate 16. For instance, the substrate 16 can be said to have a pair of generally planar surfaces 74A and 74B. The connection elements 36D each have a first end 80 that protrudes beyond the surface 74A and further include a second end 82 that protrudes beyond the surface 748.

In a similar fashion, the connection elements 36ABC each have a first end 78 that protrudes outwardly from the surface 74A. In order to enable the connection elements 36ABC to generally each protrude outwardly from the surface 74A in a fashion similar to the connection elements 38D, certain of the connection elements, in particular the connection elements 36B and 36C, must extend through the holes 74AB formed in more than one of the layers. For example, the connection elements 368 must extend through both the holes 72B formed in the layer 248 as well as the holes 72A formed in the layer 24A. Likewise, the connection elements 36C must extend not only through the holes 72C, but also through the holes 728 and the holes 72A in order to protrude outwardly from the surface 74A.

It is noted, however, that the bus elements 40A, 40AA, 40AAA, 40B, 40BB, 40BBB, 40BBBB, 40C, and 40CC are each electrically isolated from one another. The bus elements 40 are also each electrically isolated from the connection elements 36D within the interior of the substrate 16. The of bus elements 40 situated between the various adjacent pairs of layers 24ABCD may be connected with any of a variety of power sources, by way of example, with each such bus element 40 remaining isolated from each other bus element 40.

For instance, any of the bus elements 40 can carry AC or DC power at any of a wide range of voltages and current levels, as long as the various specifications of the conductor apparatus 20 are suited to carry such power. Also, the geometry is scalable to enable larger quantities of connections to be made, and the substrate 16 cart itself be made physically larger in each dimension depending upon the specific needs of the particular application.

By way of example and without limitation, the conductor assemblies 32A, 32B, and 32C are connected with the three phases of a three-phase AC electrical system, and the conductor assemblies 32AA, 32BB, and 32CC are connected with the three phases of a separate three-phase AC electrical system. The conductor assemblies 32AAA and 32BBB are each connected with separate AC electrical lines, and the conductor assembly 32BBBB is connected with DC power. It thus is understood that the bus apparatus 4 can be connected with virtually any type of power system and can be configured to meet any of a variety of electrical connection needs.

In the depicted exemplary embodiment, and as mentioned above, the substrate 16 is formed by stacking the layers 24ABCD and alternating them with layers of the bonding material 28. In the exemplary embodiment depicted herein, the bonding material 28 is in the form of thin sheets which may be on the order of 0.005 inches in thickness and which are formed with holes that correspond with the holes 72ABCD. When the bus elements 40 are received in the channels 64, and when the bonding material 28 is interposed between the adjacent pairs of the layers 24AB, 24BC, and 24CD, and when the connection elements 36D are installed in the holes 72ABCD, the components of the substrate 16 will be in a condition stacked and aligned with one another and will be ready for final assembly.

Figure 7:
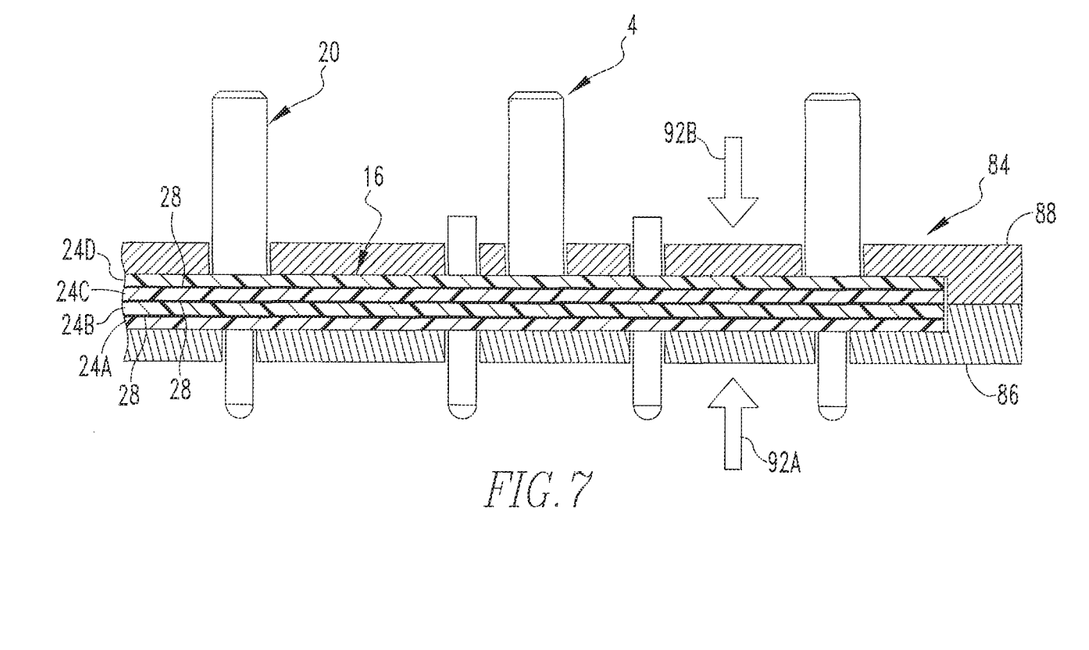
FIG. 7 is a cut away view of a portion of a curing machine during formation of the bus apparatus of FIG. 1.
Figure 8:
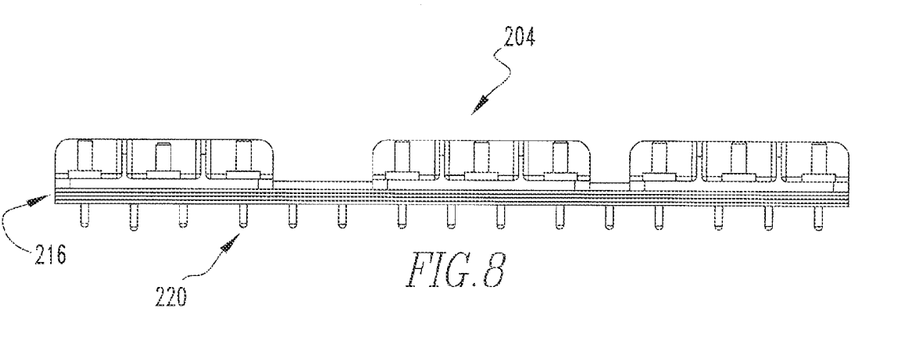
FIG. 8 is a top plan view of an improved bus apparatus in accordance with a second embodiment of the disclosed and claimed concept.
Figure 9:
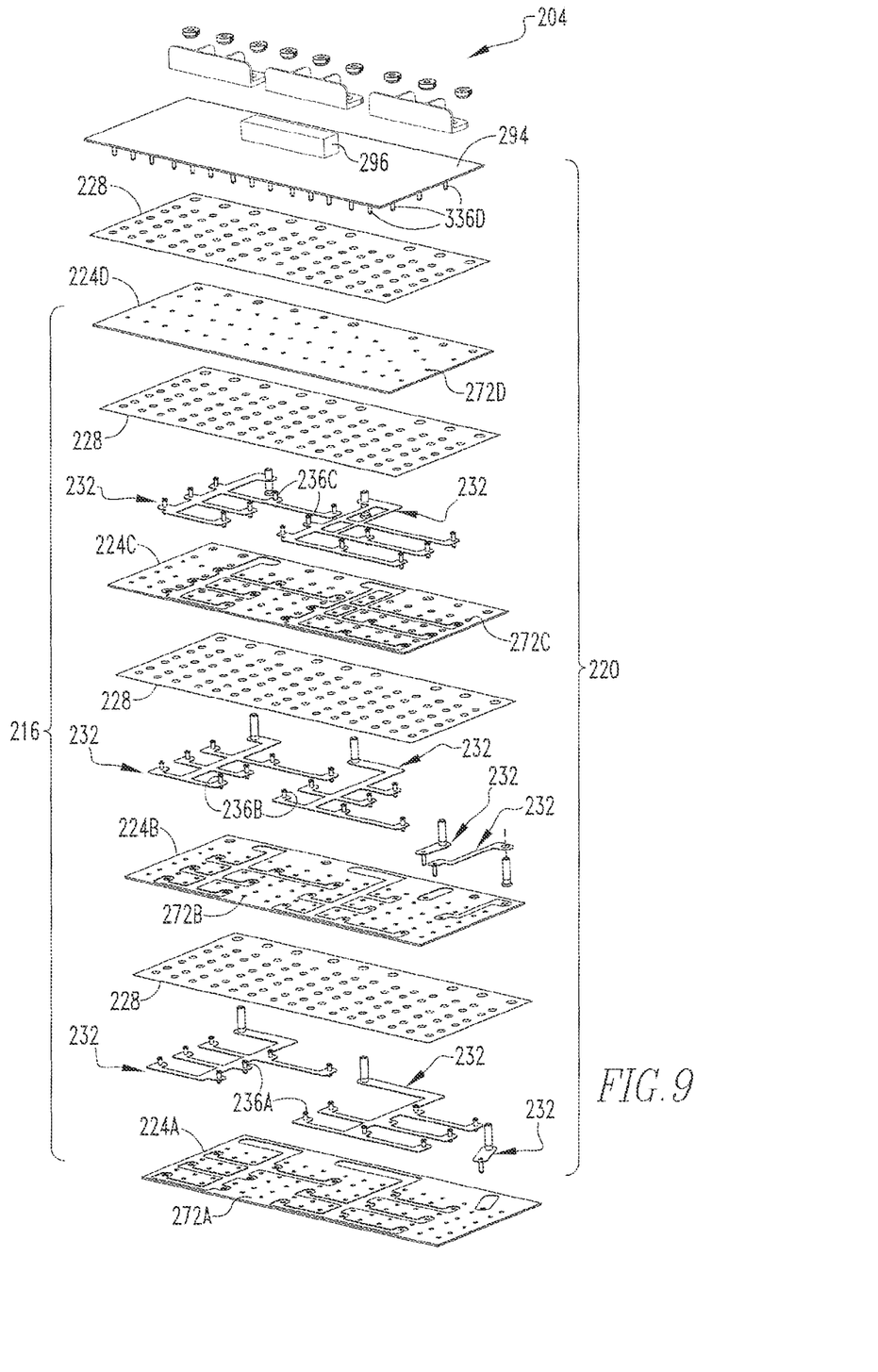
FIG. 9 is an exploded view of the bus apparatus of FIG. 8.

In particular, the stacked elements of the substrate 16 are situated in a curing machine 84, a portion of which is indicated in FIG. 7, and which includes a first mold portion 86 and a second mold portion 88 that are configured to be compressed together as shown with the arrows that are indicated generally at the numerals 92A and 92B. In particular, the stacked elements of the substrate 16 prior to curing are situated between the first and second mold portions 86 and 88, and the curing machine 84 is caused to compress together the first and second mold portions 86 and 88 and to apply heat thereto, which results in compression and temperature above ambient conditions being applied to the substrate 16. By way of example, the elements of the substrate can be heated to a temperature on the order of 200 degrees Fahrenheit and a pressure on the order of for example, 100 to 2000 psi pressure for a period of one or two hours. Other temperatures, pressures, and durations can be employed without departing from the present concept.

The application of such temperature and pressure causes the substrate 16 to cure, meaning that the bonding material 28 may transfer epoxy and become cross-linked with the adjacent layers 24ABCD. The result of the curing process may vary depending upon the specific characteristics of the bonding material 28. During such curing, the bonding material 28 may additionally cause epoxy to flow around at least a portion of the bus elements 40, as well as at least a portion of the connection elements 36ABCD, which provides a desirable dielectric and moisture barrier between the layers 24ABCD and which results in the bus elements 40 being embedded within the substrate 16.

It thus is understood that in other embodiments the bus apparatus 3 potentially may be configured without the channels 64. That is, the layers 24ABCD may simply be formed with planar surfaces and the bus elements 40 received thereon. By providing a relatively greater amount of the bonding material 28, and with curing, such additional amounts of bonding material 28 could flow into the vicinity around each bus element 40 and occupy the space between each adjacent layer 24ABCD that is not occupied by one of the bus elements 40.

After the predetermined duration of time in the curing machine 84 with the aforementioned heat and pressure, the first and second mold portions 86 and 88 are separated from one another, and the completed bus apparatus 4 with the cured substrate 16 is removed from the curing machine 84. The layers 24ABCD may each be on the order of 0.060 inches in thickness, with the result that the completed substrate 16 is on the order of one-quarter inch in thickness.

The substrate 16 is generally rigid and is strong enough to accommodate connections of circuit interrupters such as the circuit interrupter 8 with pairs of the connection elements 36ABCD. That is, the connection elements 36ABCD in the depicted exemplary embodiment can be said to be arranged in pairs 90ABC for connection with a device such as the circuit interrupter 8. For example, a pair 90A as is depicted generally in FIG. 1 includes a first end 78 of one of the connection elements 36A and a first end 80 of one of the connection elements 36D. A pair 90B includes a first end 78 of one of the connection elements 36B and a first end 80 of one of the connection elements 36D. Likewise, a pair 90C includes a first end 78 of a connection element 36C and a first end 80 of a connection element 36D. The connection elements 36D can be employed, as suggested above, for connection with loads such as the load 12. It thus can be understood that each of the pairs 90ABC includes a connection element that can be connected with a line, such as one of the connection elements 36A or one of the connection elements 36B or one of the connection elements 36C, and further includes one of the connection elements 36D that can be connected with a load. Depending upon the particular application, a circuit interrupter may be a multi-phase circuit interrupter that will be connected with more than one of the pairs 90ABC. For example, a three-phase circuit interrupter might be connected with three pairs, i.e., a pair 90A, a pair 90B, and a pair 90C, which likely would be situated adjacent one another. Other variations will be apparent.

Figure 6:
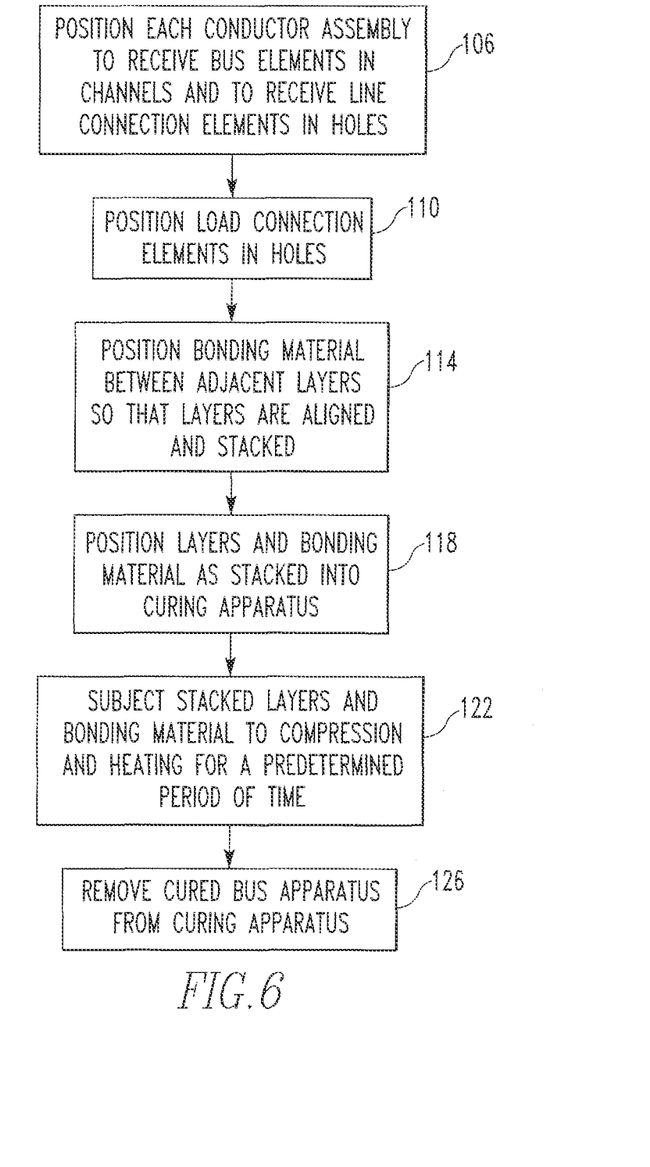
FIG. 6 is a flowchart depicting certain aspects of an improved method in accordance with the disclosed and claimed concept.

FIG. 6 depicts a flowchart which sets forth certain of the operations that are performed in assembling and curing the substrate 16. In particular, each of the conductor assemblies 32 is positioned, as at 106, with the bus elements 40 received in the channels 64 and with the connection elements 36ABC which, in the depicted exemplary embodiment, are line connection elements, received in the holes 72ABC. The connection elements 36D which, in the depicted exemplary embodiment are load connection elements, are received in the holes 72B, as at 110. In this regard, it can be seen that each of the exemplary connection elements 36D includes an annular flange at generally the midpoint thereof that engages at least the layer 24B and serves as a support element. Such annular flange helps to secure the connection elements 36D to the substrate 16 and to resist unintended extraction of the connection elements 36D from the substrate 16 during insertion and removal of circuit interrupters 8 and loads 12. Moreover, it is noted that the connection elements 36ABC likewise each include an annular flange which serves as a support element and which helps to secure such connection elements 36ABC against unintended separation from the cured substrate 16. With reference to at least FIGS. 5-6, at least some of the additional connection elements 36ABCD each comprise an elongated shank and a support element protruding from the shank in a direction transverse to the direction of elongation. Further, the support element is engaged with a layer from among the plurality of layers 24ABCD.

The bonding material 28 is then positioned between adjacent pairs of the layers 24ABCD, as at 114, so that the layers 24ABCD and the bonding material 28 are aligned and stacked. The aligned and stacked layers 24ABCD and bonding material 28 with the conductor apparatus 20 installed thereon are then positioned, as at 118, in the curing machine 84. The uncured substrate 16 is then subjected, as at 122, to compression and heating for a predetermined period of time. The completed bus apparatus 4 with its cured substrate 16 is then removed, as at 126, from the curing machine 84.

The completed bus apparatus 4 thus enables lines to be connected with the line connectors 52 and allows loads to be connected with the second ends 82 of the connection elements 36D, and further permits circuit interrupters, such as the circuit interrupter 8, to be electrically interposed therebetween by connecting them across pairs 90ABC of the first ends 78 and 80. Various arrangements of the conductor apparatus 20 can be provided depending upon the needs of the particular application. The resultant cured substrate 16 provides to the bus apparatus a direct thermal route for dissipation of $I^2R$ heat while maintaining electrical isolation between the various conductor assemblies 32, as well as isolation from the connection elements 36D within the substrate. The bus apparatus 4 thus enables a variety of connections to be made between lines and loads and eliminates the need for the extensive wiring that had been used with previous systems. In this regard, while only a single load 12 is depicted as being connected with a single connection element 36D, it is understood that a board (not expressly depicted herein) can be proved with connectors disposed thereon that are electrically connected with the various loads of the application, and the board can be connected with the various appropriate second ends 82 of the connection elements 36D. Other variations will be apparent to one of ordinary skill in the art.

An alternative bus apparatus 204 in accordance with a second embodiment of the disclosed and claimed concept is depicted generally in FIGS. 8-11. The bus apparatus 204 is similar to the bus apparatus 4 in that the bus apparatus 204 includes a substrate 216 having a plurality of layers 224ABCD and further comprises a conductor apparatus 220 having a plurality of conductor assemblies 232 having bus elements and connection elements 236ABC.

Figure 10:
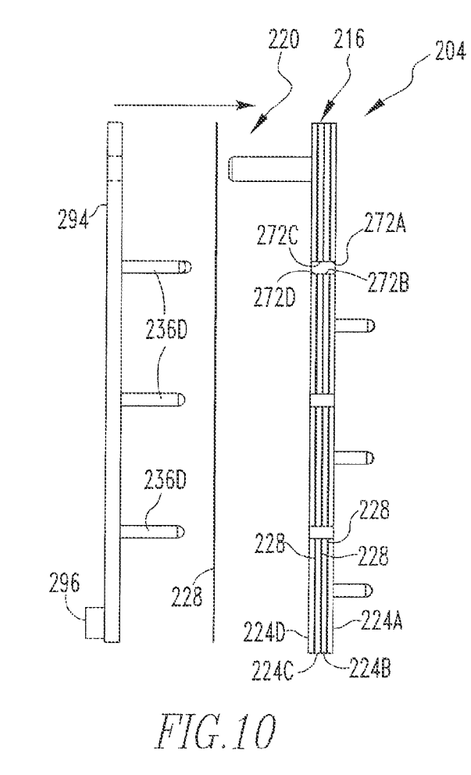
FIG. 10 depicts the assembly of a printed circuit board to the layers of a, substrate.
Figure 11:
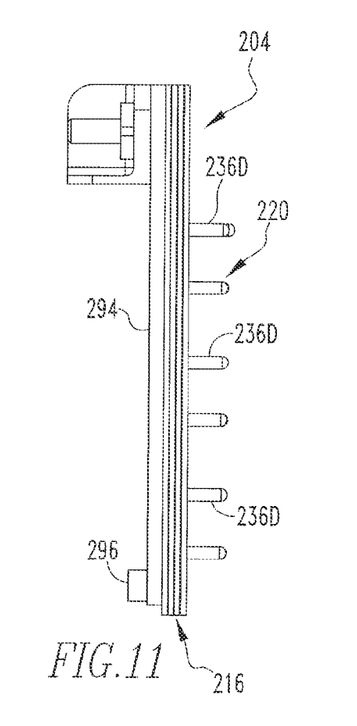
FIG. 11 depicts a left side elevational view of the bus apparatus of FIG. 8.

The bus apparatus 204 is different from the bus apparatus 4 in that the connection elements 236D of the conductor apparatus 220 are electrically connected, such as through soldering or welding, with a printed circuit board 294. For example, the connection elements 236D are soldered to appropriate locations on the printed circuit board 294, and the connection elements 236 are then received in holes 272ABCD in the layers 224ABCD. In so doing, a layer of bonding material 228 is interposed between the layer 224D and the printed circuit board 294. As such, curing of the substrate 216 together with the printed circuit board in a curing machine configured to accommodate them causes the printed circuit board 294 to be bonded together with the substrate 216 upon curing. It is noted that electrical connections can be made herein by any, appropriate methodology, including via mechanical stress, brazing, riveting, and the use of electrical connectors, by way of example.

The printed circuit board 294 has a connector 296 which includes pins or other connectors that can be connected with the various loads. The connector 296 also includes other pins or other connectors that provide one or more data channels which communicate to a remote location data derived by circuits situated on the printed circuit board 294.

While the printed circuit board 294 is depicted herein as being engaged with the layer 224D with the layer of bonding material 228 situated therebetween and with the elements then being cured together, it is noted that the installation of the printed circuit board 294 with the connection elements 236B soldered thereto can be performed after curing of the substrate 216. Other variations will be apparent.

The addition of the printed circuit board 294 thus enables the generation of data regarding the various circuits with which the bus apparatus 204 is connected and the delivery of such data to remote a location. Such data can include condition data, such as ON or OFF conditions of each circuit (and thus the circuit interrupter), as well as voltage and current levels and the like on each circuit, which is desirable. Other variations will be apparent.

While specific embodiments of the invention have been described in detail, it will be appreciated by those skilled in the art that various modifications and alternatives to those details could be developed in light of the Overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A bus apparatus that is structured to enable a number of circuit interrupters or other devices to be electrically connected with a number of circuits, the bus apparatus comprising:
 a substrate formed of a material that is structured to be electrically resistive and thermally conductive within the ranges of voltage and temperature in which the bus apparatus is structured to typically operate; and
 a conductor apparatus comprising:
  at least a first conductor assembly that comprises an electrically conductive first bus element and a number of electrically conductive first connection elements, at least some of the number of first connection elements each having an electrical connection with the first bus element, the first bus element being embedded within the substrate, the at least some of the number of first connection elements each extending from the electrical connection with the first bus element and having at least one end situated external to the substrate, and
  a number of electrically conductive additional connection elements extending through the substrate and being electrically unconnected with the first bus element within the substrate, at least some of the number of additional connection elements each having at least one end situated external to the substrate, wherein
 at least some of the additional connection elements are mounted to a printed circuit board, the printed circuit board including a connector that includes pins that provide one or more data channels that communicate to a remote location data derived by circuits situated on the printed circuit board,
 wherein the substrate comprises a plurality of layers bonded together, the plurality of layers comprising a first layer and a second layer, at least a portion of the first bus element being interposed between the first and second layers, at least one of the first layer and the second layer having formed therein an elongated channel, at least a portion of the bus element being situated in at least a portion of the channel,
 wherein the plurality of layers further comprise a third layer, and wherein the conductor apparatus further comprises a second conductor assembly that comprises an electrically conductive second bus element and a number of electrically conductive second connection elements, at least a portion of the second bus element being interposed between the second and third layers, the second bus element being embedded within the substrate, the at least some of the number of second connection elements each extending from the electrical connection with the second bus element and having at least one end situated external to the substrate
 wherein:
 the substrate comprises a generally planar first exterior surface;
 at least some of the first connection elements each have the at least one end thereof protruding from the first exterior surface;
 at least some of the second connection elements each have the at least one end thereof protruding from the first exterior surface; and
 at least some of the additional connection elements each have the at least one end thereof protruding from the first exterior surface
 wherein the substrate further comprises a generally planar second exterior surface situated opposite the first exterior surface, and wherein at least some of the additional connection elements each have a second end thereof protruding from the second exterior surface, the second ends being structured to be electrically connected with a number of circuits, and
 wherein at least some of the additional connection elements each comprise an elongated shank and a support element protruding from the shank in a direction transverse to the direction of elongation, the support element being engaged with a layer from among the plurality of layers.

2. The bus apparatus of claim 1 wherein the first layer has a plurality of first holes formed therein, and wherein the second layer has a plurality of second holes formed therein, at least some of the first connection elements being received in both a first hole and a second hole.

3. The bus apparatus of claim 1 wherein the at least one end of one of the number of first connection elements is situated adjacent a corresponding at least one end of one of the number of additional connection elements, and wherein the at least one end of one of the number of second connection elements is situated adjacent another corresponding at least one end of one of the number of additional connection elements.

4. The bus apparatus of claim 1 wherein the at least first conductor assembly comprises as the number of electrically conductive first connection elements a plurality of the first connection elements, at least one of the first connection elements comprising a connector that is structured to be electrically connected with a line conductor, another of the first connection elements and one of the additional connection elements being structured to be electrically connected with a circuit interrupter or other device, a further one other of the first connection elements and another of the additional connection elements being structured to be electrically connected with another circuit interrupter or other device.

5. The bus apparatus of claim 1 wherein the substrate is structured to be bonded together with the printed circuit board.

* * * * *